(12) United States Patent
Zhao et al.

(10) Patent No.: US 11,404,621 B2
(45) Date of Patent: Aug. 2, 2022

(54) MG-SB-BASED THERMOELEMENT, PREPARATION METHOD AND APPLICATION THEREOF

(71) Applicant: INSTITUTE OF PHYSICS, CHINESE ACADEMY OF SCIENCES, Beijing (CN)

(72) Inventors: Huaizhou Zhao, Beijing (CN); Jiawei Yang, Beijing (CN); Siyi Chang, Beijing (CN); Junling Gao, Beijing (CN)

(73) Assignee: Institute of Physics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 17/299,779

(22) PCT Filed: Feb. 22, 2019

(86) PCT No.: PCT/CN2019/075799
§ 371 (c)(1),
(2) Date: Jun. 3, 2021

(87) PCT Pub. No.: WO2020/168531
PCT Pub. Date: Aug. 27, 2020

(65) Prior Publication Data
US 2022/0020909 A1    Jan. 20, 2022

(51) Int. Cl.
*H01L 35/18* (2006.01)
*H01L 35/34* (2006.01)

(52) U.S. Cl.
CPC .............. *H01L 35/18* (2013.01); *H01L 35/34* (2013.01)

(58) Field of Classification Search
CPC ................................ H01L 35/18; H01L 35/34
See application file for complete search history.

(56) References Cited

U.S. PATENT DOCUMENTS

2017/0117453 A1* 4/2017 Tamaki ............... H01L 35/16
2019/0067548 A1* 2/2019 Nakada ............... C01B 33/06

FOREIGN PATENT DOCUMENTS

CN    105695774 A    6/2016
CN    106986315 A    7/2017
(Continued)

OTHER PUBLICATIONS

International Search Report dated May 13, 2019, issued in corresponding International Application No. PCT/CN2019/075799, filed Feb. 22, 2019, 2 pages.

*Primary Examiner* — Tae-Sik Kang
(74) *Attorney, Agent, or Firm* — Christensen O'Connor Johnson Kindness PLLC

(57) ABSTRACT

Provided by the present invention is a magnesium-antimony-based (Mg—Sb-based) thermoelement, a preparation method and application thereof. The Mg—Sb-based thermoelement comprises: a substrate layer of a Mg—Sb-based thermoelectric material positioned in the center of the thermoelement, transitional layers that are attached to the two surfaces of the substrate layer, and two electrode layer that are respectively attached to the surfaces of the two transitional layers; the transitional layers are made of a magnesium-copper alloy and/or magnesium-aluminum alloy, and the electrode layer is made of copper. The transitional layer and the electrode layer which are developed in the present invention and which are suitable for a Mg—Sb-based thermoelectric material have great significance and prospects in application. The electrode layer enable the Mg—Sb-based thermoelectric material to have an opportunity to enter the market and realize commercialization. Compared with the existing bismuth telluride thermoelectric devices in the market, the thermoelectric device prepared has lower costs, may simultaneously save the rare element tellurium, and is beneficial in saving energy and protecting the environmental.

13 Claims, 1 Drawing Sheet

(56) References Cited

FOREIGN PATENT DOCUMENTS

CN          108701749 A     10/2018
WO    WO-2017146095 A1 *   8/2017   ........... B22F 3/1039

* cited by examiner

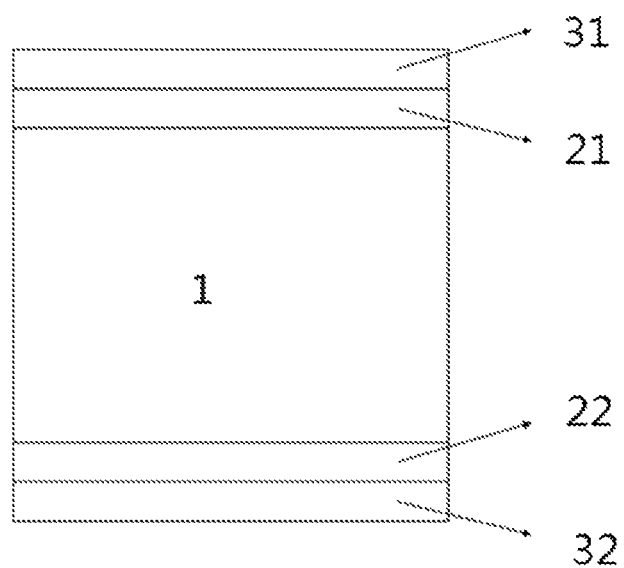

MG-SB-BASED THERMOELEMENT, PREPARATION METHOD AND APPLICATION THEREOF

TECHNICAL FIELD

The present invention relates to a magnesium-antimony-based. (Mg—Sb-based) thermoelement, a preparation method thereof and a thermoelectric refrigeration device including the Mg—Sb-based thermoelement.

BACKGROUND ART

Thermoelectric materials are functional materials that enable direct interconversion of thermal and electrical energy. The thermoelectric component made of thermoelectric materials has the advantages of light weight, small volume, simple structure, no noise, zero emission, long service life and the like. These features are of great significance to solve serious problems such as energy crisis and environmental pollution, and has therefore received high attention from countries all over the world.

With the development of new material design concepts and new device preparation processes and new technologies, the performance of thermoelectric materials has been gradually optimized and improved. At the same time, thermoelectric devices have also been commercialized to some extent. Especially in near room temperature thermoelectric refrigeration devices, bismuth telluride materials have been widely popularized and applied. However, bismuth telluride materials are expensive and toxic, which limits further large-scale use of such materials in thermoelectric refrigeration. Therefore, the development of new near-room temperature thermoelectric materials and devices is a strategic demand for the development of the entire thermoelectric field, and is also a bottleneck problem for the development of thermoelectric refrigeration industry.

Mg—Sb-based alloy is a new thermoelectric material, which has become a research hotspot in thermoelectric field since 2016. After a lot of research, the thermoelectric figure of merit of n-type Mg—Sb-based thermoelectric materials has been greatly improved through various means, and the thermoelectric figure of merit ZT at room temperature can be close to or reach 0.8.

However, there are very few reports on Mg—Sb-based thermoelectric modules compared to Mg—Sb-based materials. Traditional bismuth telluride-based thermoelectric materials are still used for thermoelectric refrigeration devices which are now widely applied to automobile air conditioning seats, environment-friendly refrigerators, etc. Compared with Mg—Sb-based thermoelectric materials, the bismuth telluride-based thermoelectric materials have high cost, and the price of the raw materials such as tellurium and bismuth is far higher than that of the raw materials such as magnesium and antimony. Prior to the discovery of high performance Mg—Sb-based thermoelectric materials, the use of bismuth telluride-based thermoelectric materials in thermoelectric refrigeration devices was irreplaceable. However, with the continuous research, the performance of Mg—Sb-based thermoelectric materials is also continuously improved, which can be comparable to bismuth telluride-based thermoelectric materials in the room temperature range, which provides a basis and possibility for the application of Mg—Sb-based thermoelectric materials in refrigeration devices.

However, in order to realize the application of Mg—Sb-based thermoelectric materials in thermoelectric devices, only good thermoelectric properties are far from sufficient; and the thermoelectric materials are required to be prepared into thermoelements so that they can be further assembled into thermoelectric refrigeration systems. The key to the preparation of thermoelements is the development of electrode layers which can be matched with Mg—Sb-based thermoelectric materials. To date, there is no report on electrode layers matched with Mg—Sb-based thermoelectric materials. As for the traditional electrode materials (e.g., aluminum, silver, copper, nickel, etc.), some cannot be tightly bonded to Mg—Sb based thermoelectric materials, some have excessive contact resistance, and some will react with the material matrix. The difficulty in the preparation of electrode materials affects the further application of Mg—Sb-based thermoelectric materials in thermoelectric devices.

Therefore, it is urgent to develop an electrode layer matched with Mg—Sb-based thermoelectric materials to realize the application of Mg—Sb based thermoelectric materials in thermoelectric devices, so that the thermoelectric refrigeration performance in room temperature region is ensured, meanwhile, the cost of the thermoelectric refrigeration material is reduced, and the development of the thermoelectric refrigeration industry is promoted.

SUMMARY OF THE INVENTION in order to realize the application of the magnesium-antimony-based (Mg—Sb-based) thermoelectric material in the field of thermoelectric devices, save the material cost and improve the economic benefits, the present invention aims to develop an electrode layer suitable for the Mg—Sb-based thermoelectric material in view of the limitations and the disadvantages of the prior art, and further discloses a Mg—Sb-based thermoelement capable of replacing N-type bismuth telluride and a preparation method thereof. The thermoelement prepared by the method and composed of N-type Mg—Sb-based thermoelectric material and P-type bismuth telluride can achieve the performance of the existing bismuth telluride-based thermoelement, and meanwhile, the cost is greatly reduced. At present, no report about the Mg—Sb-based thermoelement and the preparation method is found internationally.

Provided by the present invention is a Mg—Sb-based thermoelement, comprising:

a substrate layer of a Mg—Sb-based thermoelectric material positioned in the center of the thermoelement, transitional layers that are attached to two surfaces of the substrate layer, and two electrode layers respectively attached to the surfaces of the two transitional layers, wherein the transitional layers are made of a magnesium-copper alloy and/or a magnesium-aluminum alloy, and wherein the electrode layers are made of copper.

According to the Mg—Sb-based thermoelement provided by the present invention, wherein the composition of the magnesium-copper alloy is $Mg_mCu$, $0.5 \leq m \leq 3$, and the composition of the magnesium-aluminum alloy is $Mg_nAl$, $0.05 \leq n \leq 0.95$.

According to the Mg—Sb-based thermoelement provided by the present invention, wherein the composition of the Mg—Sb-based thermoelectric material is $Mg_{3.3-x}Z_xBi_{0.5}Sb_{1.5-y}Te_y$, wherein $0 \leq x \leq 0.1$, $0.01 \leq y \leq 0.05$, and Z is one or more elements selected from Mn, Ni, Cr, and Nb.

According to the Mg—Sb-based thermoelement provided by the present invention, wherein the thickness of the substrate layer can be adjusted according to practical use, and may be generally 0.5 mm to 2 mm; the transitional layer may have a thickness of 2 μm to 500 μm, preferably 2 μm to 100 μm; and the electrode layer may have a thickness of 2 μm to 500 μm, preferably 2 μm to 100 μm.

According to the Mg—Sb-based thermoelement provided by the present invention, wherein the upper surface and the lower surface of the substrate layer are respectively provided with a transitional layer and an electrode layer. The transitional layer on the upper surface may have a thickness the same as or different from that of the transitional layer on the lower surface; the electrode layer on the upper surface may have a thickness the same as or different from that of the electrode layer on the lower surface; and the transitional layer may have a thickness the same as or different from and that of the electrode layer.

In another aspect, the present invention also provides a preparation method of the Mg—Sb-based thermoelement, wherein the method comprises the steps of:

mixing the elementary substances of the transitional layer material into uniform transitional layer powder according to a chemical formula ratio, and placing a substrate layer of a Mg—Sb-based thermoelectric material, the transitional layer powder, and a copper foil for forming the electrode layer into a mold for spark plasma sintering (SPS) or into a hot isostatic press for pressing to obtain the Mg—Sb-based thermoelement; or the method comprises the steps of: respectively forming the transitional layer and the electrode layer on two surfaces of the substrate layer of a Mg—Sb-based thermoelectric material through a magnetron sputtering and/or thermal spraying method to obtain the Mg—Sb-based thermoelement.

According to the preparation method provided by the present invention, wherein conditions for the spark plasma sintering include: heating to 450° C.-550° C. at a heating rate of 30° C.-80° C. per minute, and holding for 1-10 min.

According to the preparation method provided by the present invention, wherein the magnetron sputtering method may include the steps of: fixing the substrate layer of a Mg—Sb-based thermoelectric material in a magnetron sputtering instrument with a copper target, a magnesium target, and optional a aluminum target, firstly depositing a magnesium-copper alloy and/or a magnesium-aluminum alloy on one surface of the substrate layer to form a transitional layer, and then depositing only a copper layer to form an electrode layer; and then depositing a magnesium-copper alloy and/or a magnesium-aluminum alloy on the other surface of the substrate layer to form a transitional layer, and depositing only a copper layer to form an electrode layer to prepare the Mg—Sb-based thermoelement.

The thermal spraying method may include the steps of: performing sand blasting treatment on two surfaces of the substrate layer of a Mg—Sb-based thermoelectric material by using carborundum, heating a magnesium-aluminum alloy wire to be molten, and spraying the melt to the surface of the substrate layer via gas combustion by adopting a flame wire spraying method to form a transitional layer; after cooling, heating a copper wire to be molten and spraying the melt onto the surface of the transitional layer via gas combustion by adopting a flame wire spraying method, and after cooling, spraying on the other surface in the same manner to obtain the Mg—Sb-based thermoelement.

According to the preparation method provided by the present invention, wherein the preparation method further comprises preparing the substrate layer of a Mg—Sb-based thermoelectric material by a spark plasma sintering method. A specific preparation process may include the steps of: putting the elementary substances of the Mg—Sb-based thermoelectric material into a ball milling tank according to a chemical formula ratio, performing ball milling for 4-24 h to obtain uniform powder, and then packing the uniform powder into a graphite mold for sintering to form an agglomerate. Preferably, the sintering process is as follows: firstly heating to 550-650° C. at a heating rate of 30-80° C. per minute, holding for 1-10 min, then heating to 750-850° C. at a heating rate of 30-80° C. per minute, and holding for 1-10 min.

In a most preferred preparation method, the preparation process of the Mg—Sb-based thermoelectric material is as follows: firstly, putting the elementary substances of the Mg—Sb-based thermoelectric material into a ball milling tank according to the chemical formula ratio, performing ball milling for 4-24 h to obtain uniform powder, and then packing the uniform powder into a graphite mold for sintering to form an agglomerate. The sintering process is as follows: firstly heating to 580-620° C. at a heating rate of 45-55° C. per minute, holding for 1-3 min, then heating to 780-820V at a heating rate of 45-55° C. per minute, and holding for 1-3 min.

In a most preferred preparation method, the magnetron sputtering method includes the steps of: firstly, putting a substrate layer of a Mg—Sb-based thermoelectric material into a beaker filled with alcohol, cleaning for 5-30 min by using an ultrasonic cleaner; drying it by using a hair dryer or a drying device; fixing it into a magnetron sputtering instrument containing a copper target and a magnesium target after drying, vacuumizing until a vacuum degree is less than 0.00066 Pa; adjusting the power of the magnesium target to 90-110 W, adjusting the power of the copper target to 70-80 W, forming a transitional layer of magnesium-copper alloy by magnetron sputtering, co-depositing magnesium and copper for 15-20 min; turning off the magnesium target, continuously depositing a copper layer at a power of 90-110 W for 20-40 min to form an electrode layer; then turning off the instrument, opening the cabin to take out tire sample, turning over and re-fixing the sample, and continuously depositing a transitional layer and an electrode layer on the other surface of the substrate layer of a Mg—Sb-based thermoelectric material by using the same process.

In a most preferred preparation method, the thermal spraying method may include the steps of: cleaning impurities on the surface of the substrate material by a traditional chemical or physical method, then carrying out sand blasting treatment by using dry carborundum and carrying out spraying by using a traditional flame wire rod in a spraying process, namely heating a prepared magnesium-aluminum alloy wire material to be molten and uniformly spraying the melt on the surface of the material substrate directly using fuel gas (may be selected from acetylene, propane or hydrogen) combustion, and cooling to room temperature; then heating a copper wire to be molten, continuously spraying the melt on the surface of the transitional layer, cooling to room temperature, and then spraying the other surface by using the same process.

In yet another aspect, the present invention also provides a thermoelectric refrigeration device including an n-type thermoelement and a p-type bismuth telluride-based thermoelement assembled together, wherein the n-type thermoelement is a Mg—Sb-based thermoelement provided by the present invention.

According to the thermoelectric refrigeration device provided by the present invention, the n-type thermoelement and the p-type bismuth telluride-based thermoelement can be assembled together by a conventional soldering process.

A transitional layer and an electrode layer are developed in the present invention, which are suitable for the Mg—Sb-based thermoelectric material and have great significance and prospects in application. Such an electrode layer enables the Mg—Sb-based thermoelectric material to have an opportunity to enter the market and realize commercialization. Compared with the existing bismuth telluride thermoelectric devices in the market, the thermoelectric device of the present invention has lower costs, may simultaneously save the rare element tellurium, and is beneficial in saving energy and protecting the environment. The Mg—Sb-based thermoelectric material element provided by the present invention can replace the existing bismuth telluride-based thermoelement in the market, can realize a new breakthrough on the cost of the existing commercial thermoelectric refrigeration device, and has great potential in improving the economic benefit.

BRIEF DESCRIPTION OF THE DRAWINGS

Embodiments of the present invention will be described below in conjunction with the accompanying drawings, wherein:
FIG. 1 is a schematic diagram of a Mg—Sb-based thermoelement according to the present invention.

DETAILED DESCRIPTION OF THE INVENTION

The present invention will be described in further detail below with reference to specific examples. The examples given are only for the purpose of illustrating the present invention, and are not intended to limit the scope of the present invention.

A schematic diagram of a Mg—Sb-based thermoelement according to the present invention is shown in FIG. 1. The Mg—Sb-based thermoelement includes: a substrate layer 1 of a Mg—Sb-based thermoelectric material positioned at the center of the thermoelement, two transitional layers 21 and 22 that are attached to both surfaces of the substrate layer, and two electrode layer 31 and 32 that are attached to the surfaces of the two transitional layers, respectively.

Example 1

(1) Mg chips, Mn powder, Bi particles, Sb particles, and Te powder were weighed according to a chemical formula $Mg_{3.275}Mn_{0.025}Bi_{0.5}Sb_{1.49}Te_{0.01}$ and ball-milled for 12 h to obtain a mixture powder, which was sintered into a cylindrical agglomerated material with a thickness of 1.2 mm and a diameter of 12.7 mm by spark plasma sintering. The sintering process was as follows: firstly heating to 600° C. at a heating rate of 50° C. per minute, holding for 2 min, then heating to 800° C., holding for 2 min, furnace cooling, and the pressure during the sintering process is 50 Mpa.

(2) Mg chips and Cu powder were weighed according to a formula $Mg_2Cu$ and ball-milled for 6 h to obtain a transitional layer powder.

(3) A substrate thermoelectric material, the transitional layer powder, and copper foils as electrode layer were placed into a mold according to the position shown in FIG. 1 for sintering. The sintering process was as follows: firstly heating to 500° C. at a heating rate of 50° C. per minute, holding for 5 min, with a pressure of 50 Mpa during the sintering process. After sintering, the thickness of the transitional layer obtained was 50 μm, and a thickness of the electrode layer obtained was 25 μm. The resulting sample was then cut into small pieces having a size of 1.45 mm×1.45 mm×1.20 mm, i.e., the Mg—Sb-based thermoelement of the present invention.

(4) 127-leg-pair thermoelectric cooling module were prepared by assembling the Mg—Sb-based thermoelement prepared in step (3) and a p-type bismuth telluride-based thermoelement with a size of 1.0 mm×1.0 mm×1.20 mm through a tin soldering process, which were subjected to a direct voltage of 12 V and produced a temperature difference of more than 50° C. between cool side and hot side, which could meet the commercial application standard.

Example 2

(1) Mg chips, Mn powder, Bi particles, Sb particles, and Te powder were weighed according to a chemical formula $Mg_{3.225}M_{0.025}Bi_{0.5}Sb_{1.49}Te_{0.01}$ and ball-milled for 12 h to obtain a mixture powder, which was sintered into a cylindrical agglomerated substrate layer of a Mg—Sb-based thermoelectric material with a thickness of 1.2 mm and a diameter of 12.7 mm by spark plasma sintering. The sintering process was as follows: firstly heating to 600° C. at a heating rate of 50° C. per minute, holding for 2 min, then heating to 800° C., holding for 2 min, furnace cooling, and the pressure during the sintering process is 50 Mpa.

(2) The substrate layer of a Mg—Sb-based thermoelectric material obtained in step (1) was put into a beaker filled with alcohol, cleaned for 20 min by using an ultrasonic cleaner, dried by using a hair dryer or a drying device, and fixed into a magnetron sputtering instrument containing a copper target and a magnesium target; the magnetron sputtering instrument was vacuumized until a vacuum degree was less than 0.00066 Pa, magnesium and copper were co-deposited for about 20 min. The power of the magnesium target was adjusted to 90-110 W, the power of the copper target was adjusted to 70-80 W, and a transitional layer of the magnesium-copper alloy was formed. Then the magnesium target was turned off, and a copper layer was continuously deposited at a power of about 75 W for about 30 min to form an electrode layer. After the deposition of copper layer, the instrument was turned off, the cabin was opened to take out the sample for re-fixation, and a transitional layer and an electrode layer were continuously deposited on the other surface of the substrate layer of a Mg—Sb-based thermoelectric material by using the same process. The thickness of the transitional layer was 2-3 μm, and the thickness of the electrode layer was 3-4 μm. The resulting sample was then cut into small pieces having a size of 1.45 mm×1.45 mm×1.20 mm, i.e., the Mg—Sb-based thermoelement of the present invention.

(4) 127-leg-pair thermoelectric cooling module were prepared by assembling the Mg—Sb-based thermoelement prepared in step (3) and a p-type bismuth telluride-based thermoelement with a size of 1.0 mm×1.0 mm×1.20 mm through a tin soldering process, which were subjected to a direct voltage of 12 V and produced a temperature difference of more than 50° C. between cool side and hot side, which could meet the commercial application standard.

While particular embodiments of the present invention have been illustrated and described, it would be obvious to those skilled in the art that various other changes and modifications can be made without departing from the spirit and scope of the present invention. Therefore, in the appended claims, it is intended to cover all such changes and modifications within the scope of the present invention.

The invention claimed is:

1. A Mg—Sb-based thermoelement, comprising:
a substrate layer of a Mg—Sb-based thermoelectric material positioned in a center of the Mg—Sb-based thermoelement;
two transitional layers that are attached to two surfaces of the substrate layer; and
two electrode layers respectively attached to surfaces of the two transitional layers, wherein the two transitional layers are made of a magnesium-copper alloy and/or a magnesium-aluminum alloy, and wherein the two electrode layers are made of copper.

2. The Mg—Sb-based thermoelement according to claim 1, wherein the magnesium-copper alloy is $Mg_mCu$, $0.5 \leq m \leq 3$, and the magnesium-aluminum alloy is $Mg_nAl$, $0.05 \leq n \leq 0.95$.

3. The Mg—Sb-based thermoelement according to claim 1, wherein the Mg—Sb-based thermoelectric material is $Mg_{3.3-x}Z_xBi_{0.5}Sb_{1.5-y}Te_y$, wherein $0 \leq x \leq 0.1$, $0.01 \leq y \leq 0.05$, and Z is one or more elements selected from Mn, Ni, Cr, and Nb.

4. The Mg—Sb-based thermoelement according to claim 1, wherein the two transitional layers have a thickness of 2-500 μm and the two electrode layers have a thickness of 2-500 μm.

5. A preparation method of the Mg—Sb-based thermoelement according to claim 1, comprising the steps of: mixing elementary substances of transitional layer material into uniform transitional layer powder according to a chemical formula ratio, then placing the substrate layer of the Mg—Sb-based thermoelectric material, the transitional layer powder, and a copper foil for forming the two electrode layers into a mold for spark plasma sintering (SPS) or into a hot isostatic press for pressing to obtain the Mg—Sb-based thermoelement; or
the method comprises the steps of: respectively forming the two transitional layers and the two electrode layers on the two surfaces of the substrate layer of the Mg—Sb-based thermoelectric material through a magnetron sputtering and/or thermal spraying method to obtain the Mg—Sb-based thermoelement.

6. The preparation method according to claim 5, wherein conditions of the spark plasma sintering comprise: heating to 450-550° C. at a heating rate of 30-80° C. per minute, and holding for 1-10 min.

7. The preparation method according to claim 5, wherein the magnetron sputtering method comprises the steps of: fixing the substrate layer of the Mg—Sb-based thermoelectric material in a magnetron sputtering instrument with a copper target, a magnesium target, and optional a aluminum target, firstly depositing the magnesium-copper alloy and/or the magnesium-aluminum alloy on one of the two surfaces of the substrate layer to form one of the two transitional layers, and then depositing only a copper layer to form one of the two electrode layers; and then depositing the magnesium-copper alloy and/or the magnesium-aluminum alloy on the other surface of the substrate layer to form the other one of the two transitional layers, and depositing only a copper layer to form the other one of the two electrode layers to obtain the Mg—Sb-based thermoelement.

8. The preparation method according to claim 5, wherein the method further comprises preparing the substrate layer of the Mg—Sb-based thermoelectric material by the spark plasma sintering method comprising: putting the elementary substances of the Mg—Sb-based thermoelectric material into a ball milling tank according to the chemical formula ratio, performing ball milling for 4-24 h to obtain uniform powder, and then packing the uniform powder into a graphite mold for sintering to form an agglomerate.

9. The preparation method according to claim 8, wherein the sintering process is as follows: firstly heating to 550-650° C. at a heating rate of 30-80° C. per minute, holding for 1-10 min, and then heating to 750-850° C. at a heating rate of 30-80° C. per minute, and holding for 1-10 min.

10. A thermoelectric refrigeration device comprising an n-type thermoelement and a p-type bismuth telluride-based thermoelement assembled together, wherein the n-type thermoelement is the Mg—Sb-based thermoelement according to claim 1.

11. A thermoelectric refrigeration device comprising an n-type thermoelement and a p-type bismuth telluride-based thermoelement assembled together, wherein the n-type thermoelement is the Mg—Sb-based thermoelement prepared by the method according to claim 5.

12. The Mg—Sb-based thermoelement according to claim 4, wherein the two transitional layers have a thickness of 2-100 μm, and the two electrode layers have a thickness of 2-100 μm.

13. The preparation method according to claim 5, wherein the thermal spraying method comprises the steps of: performing sand blasting treatment on the two surfaces of the substrate layer of the Mg—Sb-based thermoelectric material by using carborundum; heating a magnesium-aluminum alloy wire to be molten, and spraying the molten magnesium-aluminum alloy wire to one of the two surfaces of the substrate layer via gas combustion by adopting a flame wire spraying method to form one of the two transitional layers, then heating a copper wire to be molten and spraying the molten copper wire onto the surface of the one of the two transitional layers via gas combustion by adopting a flame wire spraying method after cooling, and after cooling, spraying the other surface of the two surfaces of the substrate layer and the surface of the other one of the two transitional layers in the same manner to obtain the Mg—Sb-based thermoelement.

* * * * *